United States Patent [19]

Clarke et al.

[11] Patent Number: 4,690,836

[45] Date of Patent: Sep. 1, 1987

[54] PROCESS FOR THE PRODUCTION OF VOID-FREE PREPREG SHEETS

[75] Inventors: Thomas C. Clarke, Morgan Hill, Calif.; Neng H. Lu, Endwell, N.Y.; Yaffa Tomkiewicz, Scarsdale, N.Y.; Ho M. Tong, Yorktown Heights, N.Y.

[73] Assignee: International Business Machines Corp., Armonk, N.Y.

[21] Appl. No.: 790,566

[22] Filed: Oct. 23, 1985

[51] Int. Cl.$^4$ .......................... B05D 1/18; B05D 3/02; B32B 5/02; D04H 3/08

[52] U.S. Cl. .................................... 427/299; 156/181; 427/386; 427/389.8; 427/430.1

[58] Field of Search ....................... 427/386, 389.8, 96, 427/322, 387, 299, 430.1; 156/181

[56] References Cited

U.S. PATENT DOCUMENTS

| | | | |
|---|---|---|---|
| 3,481,763 | 12/1969 | Hider et al. | 427/322 X |
| 3,843,386 | 10/1974 | Ribbans | 117/54 |
| 3,960,803 | 6/1978 | Smith et al. | 427/386 X |
| 4,076,869 | 2/1978 | Flynn | 427/386 |
| 4,180,608 | 12/1979 | Del | 428/196 |
| 4,184,004 | 1/1980 | Pines et al. | 427/387 X |
| 4,327,143 | 4/1982 | Alvino et al. | 427/386 X |
| 4,341,821 | 12/1979 | Toda | 427/299 |
| 4,348,248 | 12/1982 | Poncet | 156/276 |
| 4,350,602 | 12/1982 | Schiller | 252/75 |
| 4,375,498 | 3/1983 | Minez | 428/416 |
| 4,376,804 | 3/1983 | Katzman | 428/408 |
| 4,495,017 | 1/1985 | Abe et al. | 427/299 X |
| 4,550,128 | 10/1985 | Chellis | 427/386 X |

*Primary Examiner*—Michael R. Lusignan
*Attorney, Agent, or Firm*—Perman & Green

[57] ABSTRACT

A method is disclosed for the manufacture of void-free prepregs formed by the impregnation of a reinforcing cloth (e.g. glass fiber cloth) with a solution of a thermosetting resin (e.g. epoxy resin). In the method, the reinforcing cloth is first prewetted with a liquid medium containing a solvent for the resin which has a viscosity less than that of the solution of thermosetting resin. The prewetted cloth is impregnated with a solution of the resin and then heated to remove the solvent and cure the resin. The prepregs are used in the manufacture of printed circuit boards.

7 Claims, No Drawings

PROCESS FOR THE PRODUCTION OF VOID-FREE PREPREG SHEETS

BACKGROUND OF THE INVENTION

1. Field of the Invention

This invention relates to a process for the production of prepreg sheets used in the manufacture of electronic printed circuit boards, and in particular to prepreg sheets which are free of voids.

2. The Prior Art

In the manufacture of electronic devices, such as computers, printed circuit boards are widely used to support discrete electronic components and to provide the electrical circuitry between the components. Commercial electronic computers have become more powerful since their introduction, yet they have been reduced in physical dimensions from room size to desk size. As their size has decreased and the number of interconnections due to more powerful logic has increased, the printed circuit boards used have become denser and more complex. Today's printed circuit boards can be extremely dense, with very small geometrics and with many layers.

The printed circuit boards have a central core typically a dielectric material, such as a composite of a reinforcing cloth formed from a material such as glass fiber and a thermosetting resin such as an epoxy resin referred to in the art as a "prepreg". The term "prepreg" is derived from the face that the reinforcing cloth, e.g., a glass fiber cloth, is preimpregnated with a volatile solution containing primarily a thermosetting resin such as an epoxy resin, catalysts and/or curing agents for the resin. The prepreg has applied on at least one surface thereof a layer of conductive material such as copper. The layer or layers of conductive material are etched or otherwise processed to provide circuits of predetermined geometrical configuration. The individual printed circuit boards may then be laminated to form a multilayer structure having the etched metal circuitry sandwiched between prepreg layers.

In the manufacture of the prepreg, the reinforcing cloth suitably a glass fiber cloth is impregnated with the thermosetting resin, e.g., epoxy resin solution by passing the cloth through a bath of the resin solution. After removal from the impregnation bath, the prepreg is heated to remove the solvent. When the resin is an epoxy resin, the prepreg is heated at about 100 to 150 degrees C. to remove the solvent and to partially cure, i.e., advance the epoxy resin to the B-stage. Thereafter the prepreg is laminated on either side with a conductive material such as a thin, e.g. 1.4 mils thick, copper foil to form an individual circuit board, or the individual boards once the circuitry is defined, may be laminated, using the prepreg as the laminating layer to form multilayer structures. One drawback to the prior art processes used for the manufacture of the prepreg is that under the conditions used for commercial manufacture, i.e. high line speeds and the temperatures used for solvent removal, the prepreg sheet product contains a large number of voids, generally appearing as spherical voids in the resin matrix and as cylindrically shaped (i.e. cigar shaped) voids between the filaments of the reinforcing cloth. The term "void" as used herein means an empty space having a diameter larger than 1 to 2 mils. A printed circuit board to be acceptable for commercial use should not have a void content in excess of 10 per layer after lamination. The presence of voids in the prepreg is frequently accompanied as when a catalyst such as dicyandiamide is incorporated in an epoxy resin impregnant, by the formation of catalyst crystals which appear under polarized light, as white spots in the epoxy matrix and between the glass filaments.

The presence of voids makes it extremely difficult for the resin of the prepreg material to flow completely into the deep corners formed between circuit board and printed circuit details due to the air entrapped in the voids. The voids also promote the deterioration of laminate integrity at the interfaces between adjacent layers and lead to metal, e.g. copper, migration and the formation of short circuits between plated through holes and power planes present in the printed circuit board.

The formation of catalyst crystals in the resin matrix and between the cloth filaments degrades the moisture resistance of the prepreg and causes non-uniform curing of the thermosetting resin.

It is therefore a primary objective of the present invention to provide a simple means whereby the formation of voids and catalyst crystals in prepregs is eliminated or substantially reduced.

SUMMARY OF THE INVENTION

In accordance with the present invention, there is provided a method for impregnating a reinforcing cloth formed from inorganic filaments such as glass fibers and impregnated with a thermosetting resin such as an epoxy resin to prepare an impregnated reinforcing cloth which is substantially free of voids and crystallized compounds which normally form in such resin impregnated glass cloths, the method comprising sequentially immersing the cloth through a liquid medium comprising a solvent for the thermosetting resin to wet the cloth with the solvent, the liquid medium having a viscosity less than the thermosetting resin solution used to subsequently impregnate the cloth, passing the solvent wetted cloth through a solution of the thermosetting resin to impregnate the cloth with the resin solution and then drying the cloth to remove the solvent and partially cure the resin.

Wetting the cloth with relatively low viscosity liquid medium prior to impregnation of the cloth with the thermosetting resin solution in accordance with the method of the present invention causes the solvent to wet the cloth and displace or otherwise enhance the release of any air trapped between the filaments of the cloth as well as dissolve any crystals that may subsequently form between the filaments.

As will hereinafter be further illustrated by the low viscosity liquid prewetting step of the present invention, prepregs are obtained in which the formation of voids and crystals is substantially eliminated.

DETAILED DESCRIPTION OF THE INVENTION

The reinforcing cloth used in the preparation of the prepreg sheets of the present invention are prepared from woven or non-woven filaments of dimensionally stable fibers such as fibers of glass, boron nitride, carbon (including carbonaceous, graphitized and flame resisting fibers) and silicon carbide. Glass fiber cloths are preferred for use in the preparation of prepreg sheets used in the fabrication of printed circuit boards. The reinforcing glass fiber cloths are conventionally coated, prior to the initiation of the impregnation of the cloth, with a coupling agent such as an aminosilane coupling agent, which promotes the adhesion of the thermosetting resin impregnant to the surface of the cloth.

The thermosetting resin used as the impregnant for the reinforcing cloth used in the process of the present invention is generally a thermosetting resin such as an epoxy resin, melamine resin, phenolic resin, polyvinyl alcohol resin, polyamide-imide resin or polyimide resin.

1,2,5,6-diepoxyhexane, and 1,2,3,4-tetra(2-hydroxy-3,4-epoxybutoxy)butane.

Particularly preferred are epoxides prepared from bisphenol-A (2,2-bis[4-hydroxyphenyl]propane) phenols or cresols and epichlorohydrin. Especially suitable are bisphenol A-epichlorohydrin polyepoxide resins of the formula

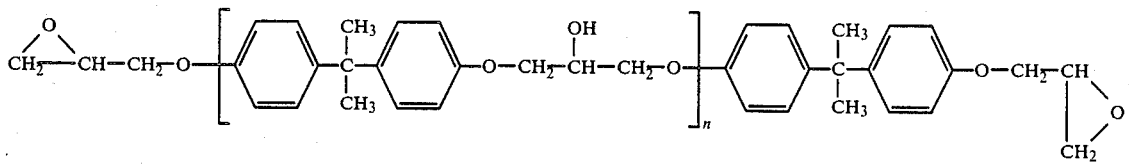

Generally speaking, the multilayer printed circuit board technology today employs, in the main, epoxy resins in combination with glass fiber reinforcing cloths for the formation of prepreg sheets. Epoxy resin systems exhibit high dielectric strength, good moisture resistance, good chemical resistance and good resistance to both mechanical and electrical shock, and epoxy/glass cloth laminates represent the most efficient structures in terms of strength to weight in existence at the present time.

Epoxy resins used in the practice of the present invention can be aliphatic, cycloaliphatic, aromatic, heterocyclic and the like and may carry such inert substituents as chlorine and others well known and commonly encountered in the art. In the formation of epoxy resins suitable for use in the practice of the present invention, there can be used virtually any epoxide produced from a polyhydric alcohol of phenol and an epihalohydrin. Typical of the epoxides that can be used successfully, are those produced from epichlorohydrin and a polyhydric phenol or alcohol such as resorcinol, catechol, 1,2,6-hexanetriol, sorbitol, mannitol, pentaerythritol, trimethylopropane and glycerol allyl ether. Similarly, polymeric materials containing polyhydric hydroxyls such as appropriately substituted polyethers and polyesters can likewise be employed. For example, there may be employed vinyl cyclohexane dioxide, epoxidized mono-, di and triglycerides, butadiene dioxide, 1,4-bis(2,3-epoxypropoxy)benzene, 1,3-bis(2,3-epoxypropoxy)benzene, 4,4'-bis(2,3-epoxypropoxy)diphenyl ether, 1,8-bis(2,3-epoxypropoxy)octane, 1,4-bis(2,3-epoxypropoxy)cyclohexane, 4,4'-bis(2-hydroxy-3,4-epoxybutoxy)diphenyldimethylmethane, 1,3-bis(4,5-epoxypentoxy)-5-chlorobenzene, 1,4-bis(3,4-epoxybutoxy)-2-chlorocyclohexane, diglycidyl thioether, diglycidyl ether, ethylene glycol diglycidyl ether, resorcinol diglycidyl ether, 1,2,5,6-diepoxyhexane-3, and epoxidized poly(o-cresols) of the formula

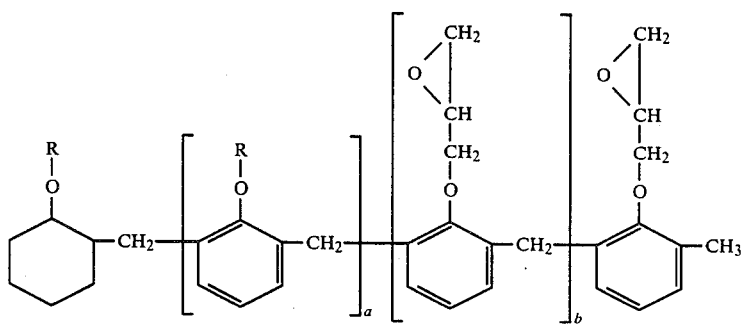

wherein n, a and b are positive numbers and R represents chlorohydrins, glycols, polymeric ether linkages and the like.

Curing catalysts are incorporated in the epoxy resin system to effect the ultimate cure of the resin. Catalysts incorporated in the epoxy resins are those normally employed in the art to produce polymerization of the epoxy resin by reaction of the oxirane ring. Curing catalysts, suitable for use in the practice of the present invention include, amines or amides such as aliphatic, cycloaliphatic or aromatic, primary, secondary and tertiary amines, for example monoethanolamine, ethylene diamine, hexamethylene diamine, trimethylhexamethylene diamine, diethylene triamine, triethylene tetramine, tetraethylene pentamine, N,N-dimethylpropylene diamine-1,3,N,N-diethylpropylene diamine 1,3,2,2-bis(4'-aminocyclohexyl)propane, 3,5,5-trimethyl-3-(aminomethyl)-cyclohexylamine, 2,4,6-tris(dimethylaminomethyl)phenol, benzyldimethylamine, dicyandiamide, benzoguanamine, imidazole, isoniazide, tetramethyl diamine, benzyl dimethylamine, metaphenolene diamine and N,N,N',N'-tetramethyl-1,3-butadiamine.

The curing catalyst is incorporated in the epoxy resin system at a concentration of about 0.5 to about 10 percent by weight and preferably about 1 to about 3 percent by weight.

In preparing the prepreg impregnating solutions, the amount of the resin system (such as resin and curing catalyst) used to prepare the impregnating solutions can vary. In preparing an epoxy resin impregnating solution, about 30 to about 60 percent by weight of the epoxy resin and any associated curing catalyst is incorporated in the solution and preferably about 40 to about 50 percent by weight of the epoxy resin/catalyst mixture is incorporated in the solution to provide a solution of conveniently handled viscosity generally having a Brookfield viscosity at 21 degrees C. of about 30 to about 50 centipoises.

The solvents used to prepare the impregnating epoxy resin system solutions are generally polar solvents such as N-methyl-2-pyrrolidone, N-acetyl-2-pyrrolidone, N,N-dimethyl-foramide, N,N-dimethyl acetamide, dimethyl sulfoxide and dimethyl imidazolidone. The solvents may be used alone or as mixtures thereof.

The liquid medium with which the reinforcing cloth is prewetted prior to its immersion in the thermosetting resin impregnant solution is desirably the same solvent or solvents with which the resin solution was prepared. Preferably the liquid medium is also a solvent in which the curing catalyst exhibits high solubility. As will hereinafter be further illustrated, the use of liquid medium solvents in which the curing catalyst exhibits high solubility insures the effective elimination of catalyst crystals in the prepreg sheet product.

In practicing the process of the present invention, a sheet of reinforcing material such as a glass cloth is fed from a supply roll and first passed through a liquid medium containing a solvent for the thermosetting resin system. The liquid medium, in addition to containing a solvent for the epoxy resin, may also have incorporated therein one or more components of the thermosetting resin system and may in fact contain up to 20 percent by weight of a thermosetting resin such as an epoxy resin. However, it is critical to the practice of the present invention, that the cloth first be immersed in a liquid medium having a viscosity substantially lower than the viscosity of the thermosetting resin impregnating solution so that the liquid medium can efficiently wet the filaments of the cloth and displace any air trapped between the filaments. The cloth may be conveniently wetted with the liquid medium by continuously passing the cloth through the liquid medium at a speed sufficient to pick up on the cloth, the desired amount of liquid medium. This speed, of course, will vary with the reinforcement cloth used, the type of construction of the cloth, the tension on the cloth as it passes through the liquid medium, the viscosity of the liquid medium and similar factors normally encountered by and apparent to those skilled in the art. Respecting tension, it will be appreciated that the extensive contact on any cloth having closely packed filaments and ends will depend to some extent on its tautness as it passes through the liquid medium.

The immersion of the reinforcing cloth in a liquid medium containing a solvent for a thermosetting resin impregnant such as an epoxy resin, or a dilute solution of the resin or catalyst, promotes the release of air trapped between the filaments of the cloth so that the voids created by the escape of air are filled with the low viscosity liquid medium which wets the cloth but which is also compatible with the solutions of thermosetting resin with which the reinforcing cloth is ultimately impregnated.

When the thermosetting resin is an epoxy resin, the liquid medium is preferably composed entirely of a solvent for the epoxy resin. N-methyl-2-pyrrolidone is a preferred solvent for use as the liquid medium both the tertiary amine catalyst and dicyandiamide which are widely used as curing catalysts for epoxy resins are very highly soluble in N-methyl2-pyrrolidone. Other preferred solvents include methyl cellosolve (ethylene glycol monomethyl ether) and ethylene glycol.

The temperature of the liquid medium with which the cloth is wetted prior to impregnation with the thermosetting resin solution is maintained at 15 to 30 degrees C. during immersion of the cloth in the liquid medium.

After removal from the liquid medium, the liquid medium wetted reinforcing cloth is immersed, as by passage through a solution of the thermosetting resin, at speed sufficient to pick up on the reinforcing cloth, the desired amount of impregnating solution. As in the case of wetting the cloth with the liquid medium, the speed will vary with the reinforcement material used, the construction of the cloth, and the tension on the reinforcing substrate as it passes through the solution and the viscosity of the thermosetting resin.

After the reinforcing cloth has been impregnated to the desired level (generally about 40 to about 60 percent by weight of the resin system on the cloth), the impregnated composite is dried at elevated temperature conditions to substantially completely remove the solvent and to leave behind a resin/catalyst system in a substantially unadvanced uncrosslinked state. In the case of epoxy resins, the drying temperature range can vary from 100 to 140 degrees C. which temperatures will advance the epoxy resin to the B-stage.

To manufacture printed circuit boards using an epoxy resin impregnated glass cloth having a thickness of 0.003 to 0.009 inches, the cloth is laminated to a copper foil layer of 1 to 4 mils thick at a pressure of about 150 to 300 psi and a temperature of about 170 to 200 degrees C. for aobut 20 to about 60 minutes in a standard press whereby the epoxy resin will be fully cured, i.e. extensively cross-linked. Multilayer printed circuit boards are manufactured by bonding fully cured epoxy resin/glass cloth composites with surface bonded copper patterns using the epoxy prepreg at elevated temperature and pressures, e.g. 150 to 200 degrees C. and 200 to 700 psi.

The following example is illustrative of the process of the present invention.

EXAMPLE

In a series of runs, a woven glass fiber cloth of the type conventionally used in the manufacture of epoxy resin prepregs (cloth 1675 available from Uniglass Company) was cut into half-inch square segments and manually immersed in a solvent in which epoxy resins are known to be soluble, namely, methyl ethyl ketone (MEK), ethylene glycol monomethyl ether (EGME) N-methyl pyrrolidone (NMP). After immersion in the solvent, the wet cloth was removed from the solvent and immediately immersed in an epoxy resin system comprised of 142 parts of an epoxy resin solution, and 53.3 parts of a catalyst solution, the solution compositions of which are listed below:

|  | Parts |
| --- | --- |
| Epoxy Resin |  |
| Bisphenol A type epoxy resin | 90.0 |
| Epoxy cresol novolac | 10.0 |
| Methyl ethyl ketone solvent | 42.0 |
| Catalyst |  |
| Dicyandiamide | 3.0 |
| Tetramethylbutane diamine | 0.3 |
| Methyl cellosolve solvent | 50.0 |

The epoxy resin system impregnated glass cloth was heated on a microscope slide with a programmable hot stage (Mettler FPX 52) over a prescribed heating schedule to remove the solvents and cure the epoxy resin. Initially heating the impregnated cloth below the boiling point of the wetting solvent ensured gradual removal of solvents. The heating schedules were as follows:

| HEATING SCHEDULE | | | | | | | |
|---|---|---|---|---|---|---|---|
| | MEK | | | EGME | | | NMP |
| Temp. (°C.) | 60° | 120° | 150° | 90° | 120° | 150° | 60°–170° |
| Time (min.) | 2 | 1–2 | 1 | 1.5– | 1–4 | 1–2 | 2–7 |
| Boiling Point (°C.) | | 80° | | | 125° | | 202° |

During heating, a flow of air at 23 degrees C. was occasionally imposed on the sample to maintain the stage temperature. The fully cured prepreg epoxy/cloth composite was then examined under a microscope (40×magnification) for the presence of voids. No voids were found in any of prepregs.

For purposes of comparison, the procedure of Example I was repeated with the exception that the cloth was not prewetted with a solvent. Examination of the comparative prepreg under a microscope (40×magnification) indicated that the comparative prepreg had more than 1000 voids/cm$^2$.

EXAMPLE II

The procedure of Example I was repeated with the exception that a roll of the glass cloth was first passed through a series prewetting bath containing different wetting solvent, and then passed through a bath containing the epoxy resin system. The epoxy resin impregnated cloth was then passed through two ten foot long heat zones (1st zone 149° C., 2nd zone, 177° C.) for a total of 4 minutes residence time under a tension of 3–4 lbs/in and a rolling speed of 4 ft/min. to remove the solvent and cure the epoxy resin.

The fully cured prepregs were then examined under a microscope (40×magnification) for the presence of voids and dicyanamide crystals. The results are recorded in Table 1 below.

For purposes of comparison, the procedure of Example I was repeated with the exception that the glass cloth was not prewetted with any solvent. The results of the testing on the comparative prepreg is also recorded in the Table under the designation "Control".

TABLE

| | Control | MEK | EGME | NMP |
|---|---|---|---|---|
| Voids | bad* | bad | half control | nearly none** |
| Crystals | bad | bad | half control | very few*** |
| Solubility g catalyst/ 100 g Solvent | — | poor | 13.2 | 39.0 |

*bad means greater than 1000 voids/cm$^2$ or 500/cm$^2$ crystals counted
**nearly none means less than 5 voids/cm$^2$ counted
***very few means less than 20 crystals/cm$^2$ counted.

By reference to the Table, it is immediately apparent that prewetting the glass cloth with a solvent such as ethylene glycol monomethyl ether or N-methyl pyrrolidone solvents in which the curing catalyst is relatively soluble, is very effective in reducing the amount of voids and crystals in the epoxy resin prepreg.

While specific components of the present system are defined above, many other variables may be introduced which may in any way affect, enhance, or otherwise improve the system of the present invention. These are intended to be included herein.

Although variations are shown in the present application, many modifications and ramifications will occur to those skilled in the art upon a reading of the present disclosure. These, too, are intended to be included herein.

Having thus described our invention, what we claim as new, and desire to secure by Letters Patent is:

1. A method for reducing the void content in a prepreg sheet which is prepared by impregnating a reinforcing cloth with a solvent solution of a thermosetting resin, the method comprising first immersing the cloth in a liquid medium having a viscosity less than the solution of thermosetting resin, then immersing the prewetted cloth in a resin solvent solution to impregnate the cloth with said resin solvent solution and then heating the cloth to remove the solvent and cure the resin.

2. The method of claim 1 wherein the thermosetting resin is an epoxy resin.

3. The method of claim 1 wherein the cloth is a glass fiber cloth.

4. The method of claim 1 wherein a curing catalyst is incorporated in the thermosetting resin solution.

5. The method of claim 4 wherein the cloth is prewetted with a liquid medium which is a solvent for the resin and which exhibits a high solubility for the catalyst.

6. The method of claim 2 wherein the solvent is N-methyl pyrrolidone.

7. The method of claim 2 wherein the solvent is ethylene glycol monomethyl ether.

* * * * *